United States Patent [19]
Chang

[11] Patent Number: 6,107,006
[45] Date of Patent: Aug. 22, 2000

[54] METHOD FOR FORMING PATTERN

[75] Inventor: Wen-Pin Chang, Ilan Hsien, Taiwan

[73] Assignee: Winbond Electronics Corp., Hsinchu, Taiwan

[21] Appl. No.: 09/270,831

[22] Filed: Mar. 18, 1999

[30] Foreign Application Priority Data

Jan. 18, 1999 [TW] Taiwan .................................. 88100723

[51] Int. Cl.⁷ ...................................................... G03F 7/20
[52] U.S. Cl. .......................................... 430/322; 430/312
[58] Field of Search ..................................... 430/312, 322

[56] References Cited

U.S. PATENT DOCUMENTS

| | | | |
|---|---|---|---|
| 5,091,289 | 2/1992 | Cronin | 430/312 |
| 5,120,622 | 6/1992 | Hanrahan | 430/7 |
| 5,139,918 | 8/1992 | Goel | 430/166 |
| 5,310,622 | 5/1994 | Sardella | 430/313 |
| 5,905,018 | 5/1999 | Bhatt | 430/315 |

FOREIGN PATENT DOCUMENTS 0 855 621 A2  7/1998  European Pat. Off. .

*Primary Examiner*—Kathleen Duda
*Assistant Examiner*—Nicole Barreca
*Attorney, Agent, or Firm*—Nath & Associates PLLC; Harold L. Novick

[57] ABSTRACT

Disclosed is a method for forming a pattern by which the T-top formation problem of chemically amplified resists is eliminated. Preferably, an i-line resist is employed as a barrier layer to protect the underlying chemically amplified resist from base attack. The i-line resist used herein can be exposed and developed by a normal deep-UV lithography process without substantially affecting the performance of chemically amplified resists.

9 Claims, 2 Drawing Sheets

METHOD FOR FORMING PATTERN

BACKGROUND OF THE INVENTION

1. Field of the Invention

The present invention relates in general to a method for forming a pattern during the manufacturing of a semiconductor. More particularly, it relates to a method for solving the T-top formation problem in a chemically amplified resist process.

2. Description of the Related Arts

Chemically amplified resists are an important class of resists for deep UV exhibiting high photo-speed, excellent resolution, and process tolerance. The chemically amplified resist consists of a polymer host and a generator of acid in the presence of light. In the post-exposure bake, the photo-generated acid catalyzes thermal reactions that alter the solubility of the exposed region. Generally, resolution and sensitivity are affected by post-exposure conditions.

Prior art chemically amplified positive photoresists, however, suffer from the problem known as post-exposure delay (PED). When deep-UV lithography is carried out, line patterns have a T-top configuration; that is, patterns become thick at the top if the delay time from exposure to post-exposure baking is extended. This problem not only makes dimensional control in the lithography process difficult, but also adversely affects dimensional control in the processing of substrates using dry etching.

It is understood that basic compounds in the air largely cause in the T-top formation phenomenon for these chemically amplified positive resist materials. In the following, a conventional pattern forming method will be described with reference to FIGS. 1A to 1D, by which the T-top formation phenomenon will be illustrated.

Referring to FIG. 1A, a semiconductor substrate 1 is coated at its top with the chemically amplified resist, thereby forming a resist film 2 with a thickness of 1 $\mu$m. Next, as shown in FIG. 1B, exposure 4 is performed at 25 mJ/cm$^2$ on the resist film 2 through a mask 3, using a KrF excimer laser stepper, whereby acid is generated in the exposed regions.

Next, as shown in FIG. 1C, after performing heating 5 for 90 seconds on the semiconductor substrate 1 at a temperature of 95° C., the exposed regions of the resist film become alkali-soluble under the catalysis of the photogenerated acid. After this, the resist film 2 is developed for 60 seconds in an alkaline solution of 2.38 wt %, whereby a resist pattern 6 of a positive type is defined as shown in FIG. 1D.

However, in the resist pattern 6 which is formed, acid which is generated by the acid generating agent is easily deactivated by basic compounds in the air since it is only present in a catalytic amount. Thereby, the profile of the resist pattern 6 often deteriorates, as shown in FIG. 1D. In short, the photogenerated acid is deactivated due to a basic compound, such as $NH_3$ or NMP, which usually exists within the clean room. Thereby, an upper portion of the resist pattern 6 does not become alkali-soluble, whereby an upper portion of the exposed portion of the resist pattern 6 remains even after developed in an alkaline solution.

This T-top formation of the resist film will result in pattern profile change and CD variation when etching is performed on a film using such a resist pattern.

There is a strong demand for a method for solving the T-top formation problem of chemically amplified positive resists. Examples of prior art methods regarding this can be found in U.S. Pat. Nos. 5,756,262 to Endo et al. and 5,629,134 to Oikawa et al.

SUMMARY OF THE INVENTION

Considering the above, the present invention aims to provide a novel method for forming a pattern, by which the T-top formation problem of chemically amplified resists is eliminated.

In order to achieve this, a resist other than a chemically amplified resist, preferably an i-line resist, is coated onto the chemically amplified resist as a barrier layer. The i-line resist used herein can be exposed and developed along with a chemically amplified resist by a normal deep-UV lithography process, but its mechanism is somewhat different. The i-line resist produces a considerable quantity of carboxylic acid upon exposure and is thereby made alkali-soluble. In contrast, the chemically amplified resist produces a catalytic amount of acid upon exposure and is not made alkali-soluble until the post-exposure baking. Upon exposure, carboxylic acid is generated in the exposed regions of the i-line resist film, which traps the diffused base before it can reach the underlying chemically amplified resists. Thus, the i-line resist servers as a barrier layer preventing the chemically amplified resist from base attack during the delay between exposure and the post-exposure baking. The T-top tendency of the resist pattern is eliminated without substantially affecting the performance of chemically amplified resists.

The pattern forming method according to the present invention comprises: forming a first resist film by coating a substrate with a chemically amplified resist; forming a second resist film over the first resist film by coating the substrate with a resist other than a chemically amplified resist; exposing the first resist film and the second resist film through a mask; and developing the first resist film and the second resist film so exposed, thereby forming a resist pattern.

According to the invention, the second resist film is preferably formed by coating an i-line resist or, in the alternative, a resist comprised of a resin, a solvent, and an alkali-insoluble photoactive compound which is converted into a carboxylic acid and becomes alkali-soluble when irradiated with an energy ray. For example, the resin could be a Novolac resin, the solvent could be ethyl lactate or methyl 3-methoxypropionate, and the photoactive compound could be a diazo such as dizonaphthoquinone and the like. Examples of commercially available i-line resists include TSCR-80I (Tokyo-oka), PFI28 (Sumitomo Chemical), and FHI-3950 (Fuji Hunt).

Examples of commercially available chemically amplified resists include APEX-E (Shipley), DX46 (Hoechst), ARCH (Fuji Hunt), DP009 (Tokyo Ohka). Generally, a chemically amplified resist is comprised of a resin having an acid unstable group, a photoacid generator, a solvent, additives, and optionally a dissolution inhibitor.

Other objects, features, and advantages of the present invention will become apparent from the following detailed description which makes reference to the accompanying drawings.

DESCRIPTION OF THE PREFERRED EMBODIMENT

In the following, a pattern forming method according to a preferred embodiment of the present invention will be described.

Figure 1A:
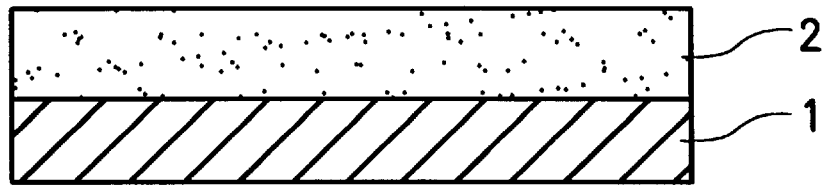
FIGS. 1A to 1D are cross sectional views for describing the respective steps of a conventional pattern forming method.
Figure 1B:
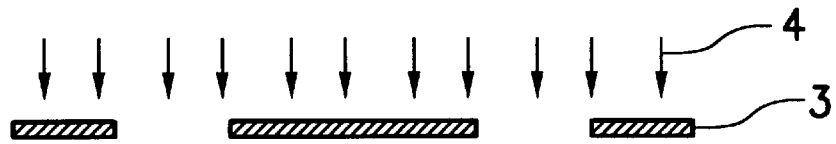
Figure 1B:
Figure 1C:
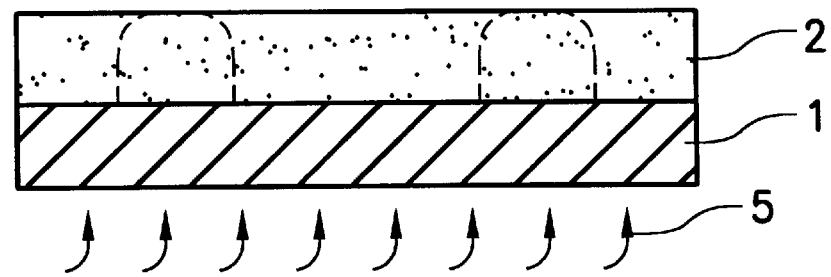
Figure 1D:
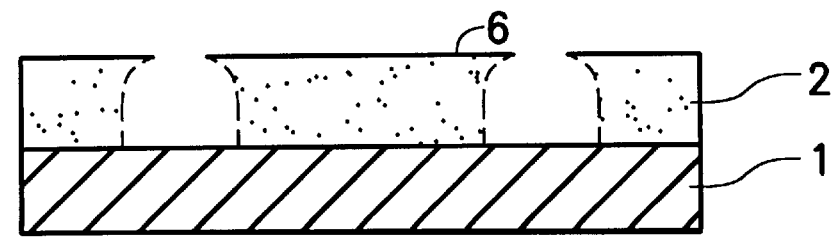
Figure 2A:
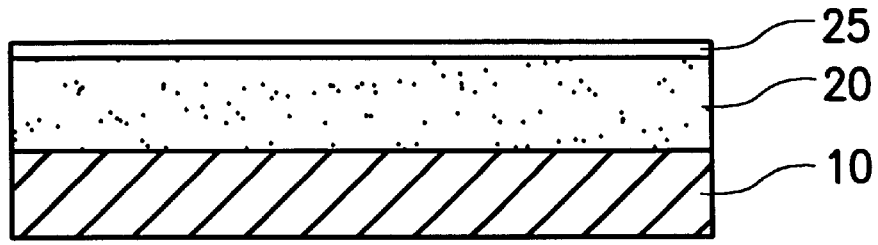
FIGS. 2A to 2D are cross sectional views for describing the respective steps of a pattern forming method according to a preferred embodiment of the present invention.

Referring to FIG. 2A, a semiconductor substrate 10 is coated at its top with a chemically amplified resist, and a first resist film 20 having a thickness of about 0.5 to 1.5 μm is formed. With the semiconductor substrate resting on a hot plate at 80° to 120° C., the coating is prebaked for 120 seconds. Following this, a second resist film 25 having a thickness of about 100 to 600 Å is formed over the first resist film 20 by coating an i-line resist thereon. The second resist film 20 is also prebaked at 80° to 120° C. for about 120 seconds.

Figure 2B:
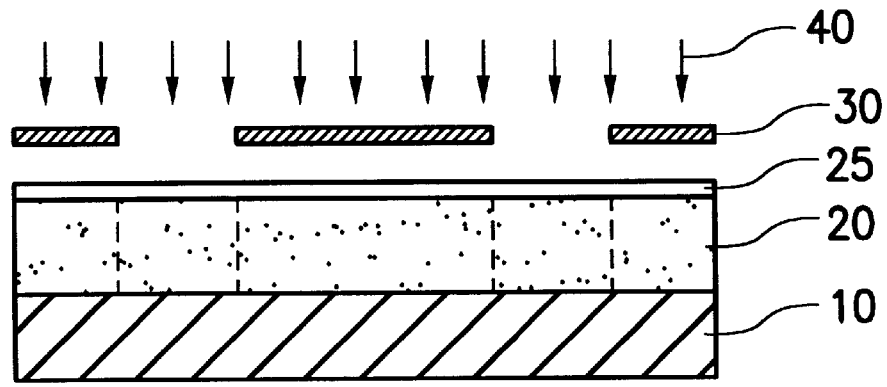

Next, as shown in FIG. 2B, exposure 40 is then performed on the first resist film 20 as well as on the second resist film 25 through a mask using a KrF excimer laser stepper. Upon exposure, the photoactive compound in the exposed regions of the first resist film 25 is converted into a carboxylic acid. Therefore, any basic compound diffused into the substrate surface will be immediately trapped by the carboxylic acid, thus preventing the underlying photogenerated acid from deactivation. The T-top tendency of the resist pattern is eliminated.

Figure 2C:
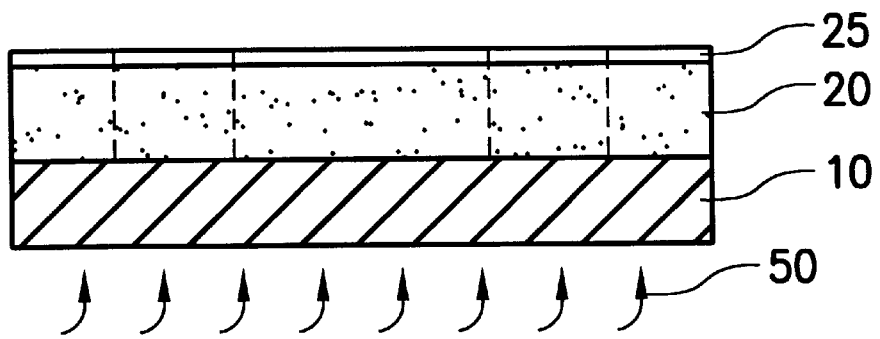
Figure 2D:
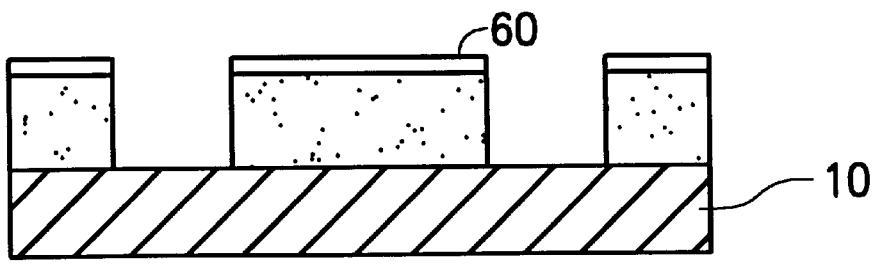

Next, as shown in FIG. 2C, after performing heating 50 for 60 to 120 seconds on the semiconductor substrate 10 at a temperature of 70° to 100° C., the resist films 20 and 25 are developed in an aqueous solution of 2.38% tetramethylammonium hydroxide. Thereby, a resist pattern 60 of a positive type is defined, as shown in FIG. 2D. Since the deactivation of the photogenerated acid is prevented, the resist pattern 60 has a sidewall nearly perpendicular to the substrate as shown in FIG. 2D.

The foregoing has described the preferred embodiment in relation to a case where an i-line resist is employed as a barrier layer. However, in addition to i-line resists, any other resist materials containing a photoactive compound which is converted into an acid when irradiated with an energy ray are qualified as a barrier layer if they can be exposed and developed along with chemically amplified resists by a normal deep-UV lithography process.

While the invention has been particularly shown and described with the reference to the preferred embodiment thereof, it will be understood by those skilled in the art that various changes in form and details may be made without departing from the spirit and scope of the invention.

What is claimed is:

1. A method for forming a pattern, comprising the steps of:

forming a first resist film by coating a substrate with a chemically amplified resist;

forming a second resist film over the first resist film by coating the substrate with a resist other than a chemically amplified resist;

simultaneously exposing the first resist film as well as the second resist film through a mask; and developing the first resist film and the second resist film so exposed, thereby forming a resist pattern.

2. The method as claimed in claim 1, wherein the resist other than a chemically amplified resist is comprised of a resin, a solvent, and an alkali-insoluble photoactive compound which is converted into a carboxylic acid and becomes alkali-soluble when irradiated with an energy ray.

3. The method as claimed in claim 1, wherein the resist other than a chemically amplified resist is an i-line resist.

4. The method as claimed in claim 1, wherein the second resist film has a thickness of about 100 to 600 Å.

5. A method for forming a pattern, comprising the steps of:

forming a first resist film by coating a substrate with a chemically amplified resist;

forming a second resist film over the first resist film by coating the substrate with a resist other than a chemically amplified resist;

simultaneously exposing the first resist film as well as the second resist film through a mask;

heating the substrate; and developing the first resist film and the second resist film so exposed, thereby forming a resist pattern.

6. The method as claimed in claim 5, wherein the resist other than a chemically amplified resist is comprised of a resin, a solvent, and an alkali-insoluble photoactive compound which is converted into a carboxylic acid and becomes alkali-soluble when irradiated with an energy ray.

7. The method as claimed in claim 5, wherein the resist other than a chemically amplified resist is an i-line resist.

8. The method as claimed in claim 5, wherein the second resist film has a thickness of about 100 to 600 Å.

9. The method as claimed in claim 5, wherein said heating is performed at a temperature of 70° to 100° C. for 60 to 120 seconds.

* * * * *